US010349559B2

(12) United States Patent
Trumbo et al.

(10) Patent No.: US 10,349,559 B2
(45) Date of Patent: Jul. 9, 2019

(54) COOLING FAN ASSEMBLY AND GUIDANCE TRACK FOR INSTALLING AND REMOVING A COOLING FAN

(71) Applicant: Lenovo Enterprise Solutions (Singapore) Pte. Ltd., Singapore (SG)

(72) Inventors: Brian A. Trumbo, Apex, NC (US); David J. Jensen, Raleigh, NC (US); Alvin G. Davis, Durham, NC (US); Mark S. Bohannon, Wake Forest, NC (US); Paul A. Wormsbecher, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 453 days.

(21) Appl. No.: 15/183,477

(22) Filed: Jun. 15, 2016

(65) Prior Publication Data

US 2017/0363105 A1   Dec. 21, 2017

(51) Int. Cl.
| | | |
|---|---|---|
| H05K 7/20 | (2006.01) | |
| F04D 25/06 | (2006.01) | |
| F04D 29/60 | (2006.01) | |
| G11B 33/00 | (2006.01) | |

(52) U.S. Cl.
CPC ..... *H05K 7/20736* (2013.01); *F04D 25/0613* (2013.01); *F04D 25/0693* (2013.01); *F04D 29/601* (2013.01); *G11B 33/00* (2013.01); *H05K 7/20172* (2013.01); *H05K 7/20727* (2013.01)

(58) Field of Classification Search
CPC ......... H05K 7/20709; H05K 7/201718; H05K 7/20727; H05K 7/20736; H05K 7/20554; H05K 7/20581; H05K 7/20172
See application file for complete search history.

(56) References Cited

U.S. PATENT DOCUMENTS

| | | | | |
|---|---|---|---|---|
| 5,562,410 | A * | 10/1996 | Sachs | F04D 29/601 361/695 |
| 5,721,670 | A * | 2/1998 | Cochrane | H05K 7/20172 165/80.3 |
| 8,089,754 | B2 * | 1/2012 | Peng | H05K 7/20727 312/236 |
| 8,295,041 | B2 * | 10/2012 | Cheng | H05K 7/20736 165/80.3 |
| 9,066,444 | B2 * | 6/2015 | Adrian | H05K 7/20172 |
| 9,661,787 | B2 * | 5/2017 | Hall | H05K 7/20718 |

(Continued)

*Primary Examiner* — Igor Kershteyn
*Assistant Examiner* — Topaz L. Elliott
(74) *Attorney, Agent, or Firm* — Jeffrey L. Streets

(57) ABSTRACT

An apparatus includes a fan having a fan housing with guidance members extending from opposing sides of the housing, wherein the fan housing has a depth that is less than a height and width. A handle is pivotably coupled to the fan housing, and guidance tracks are positioned on opposing sides of an open channel. Each of the guidance tracks has a first track portion extending from a first face of a chassis in a first direction into the chassis and a second track portion extending from the first track portion in a second direction. The guidance members move along the corresponding guidance tracks, wherein the fan housing moves along the first track portion in a sideways orientation and reaches an operating orientation in the second track portion.

18 Claims, 7 Drawing Sheets

(56) References Cited

U.S. PATENT DOCUMENTS

2013/0216365 A1\* 8/2013 Dalgaard .............. F04D 25/166
  415/182.1
2015/0216069 A1\* 7/2015 Hori ................... H05K 7/20727
  361/679.48

\* cited by examiner

COOLING FAN ASSEMBLY AND GUIDANCE TRACK FOR INSTALLING AND REMOVING A COOLING FAN

BACKGROUND

Field of the Invention

The present invention relates to a cooling fan for an electronic device, and more specifically to a method and apparatus for installing and removing a cooling fan in a chassis supporting an electronic device.

Background of the Related Art

Server density continues to be a key factor in market requirements. Likewise, concurrent maintenance remains a key market requirement, especially for high end server systems. Because most server systems are designed for an industry standard rack, of which a 19" width is the most prevalent, the width of a server cannot exceed 450 mm. Additionally, there is pressure to minimize the height of the server so that the number of servers that can be installed in a rack is maximized. Therefore, the frontal space of a server system is tightly constrained. When concurrent maintenance is considered, one would want as many devices as possible to be serviced through the front of the server without hindering the operation of devices not being serviced.

Commonly, the type of devices that would be required to be serviced through the front of the system are hard disk drives, HDDs (which now includes non-rotating media such as flash drives) and cooling fans. This means HDDs and cooling fans compete for the same limited front space of the server. In order to access both HDDs and cooling fans from the front of the system, the system design would require one of two solutions. The first solution would be to grow the frontal space in height so that the HDDs and fans can all be accessed from the front without having to disconnect or remove one or the other to get access to the device to be removed. This solution is in conflict with market requirements for high density. The second solution would be to use depth of the system to have the fans behind the HDDs and have the HDDs removable through the front while still being operational. While this second solution solves the frontal space issue, it creates a complex design of needing a sliding mechanism for the HDDs to slide out of the way of the fans without causing disruption to the read/write of the drives while they are extended out the front of the system. Also, an elaborate cable management system would be needed to provide for the SAS/PCIe/power cables to the drive backplanes in order to extend and retract while a fan is being accessed. Neither of these two solutions is desirable.

BRIEF SUMMARY

One embodiment of the present invention provides an apparatus comprising a first fan having a first fan housing with first and second guidance members extending from opposing sides of the first fan housing, wherein the first fan housing has a depth that is less than a height and width. The apparatus further comprises a first handle pivotably coupled to the first fan housing, and first and second guidance tracks positioned on opposing sides of an open channel. Each of the first and second guidance tracks has a first track portion extending from a first face of a chassis in a first direction into the chassis and a second track portion extending from the first track portion in a second direction. The first guidance member moves along the first guidance track and the second guidance member moves along the second guidance track, wherein the first fan housing moves along the first track portion in a sideways orientation and reaches an operating orientation in the second track portion.

Another embodiment of the present invention provides a method comprising inserting a first fan into an open channel of a chassis in a sideways orientation, engaging the first fan with a first track that extends into the chassis through the open channel, and pushing the first fan along the first track using a first handle, wherein the first track guides the first fan through the open channel in the sideways orientation to a first operable position in an operating orientation.

DETAILED DESCRIPTION

Figure 1:
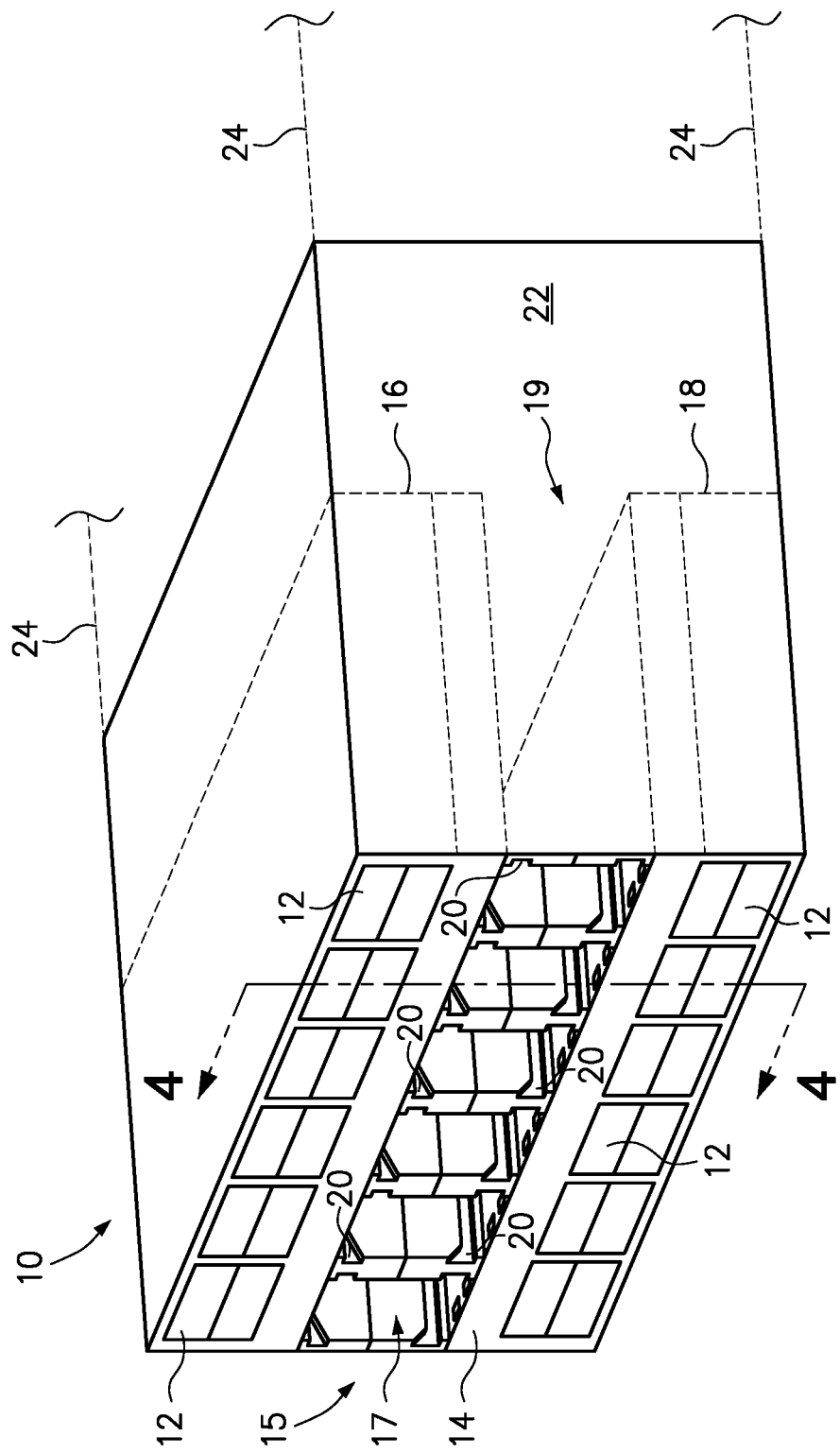
FIG. 1 is a perspective view of a chassis capable of supporting a plurality of components and fans installed from a front face of the chassis.

One embodiment of the present invention provides an apparatus comprising a first fan having a first fan housing with first and second guidance members extending from opposing sides of the first fan housing, wherein the first fan housing has a depth that is less than a height and width. The apparatus further comprises a first handle pivotably coupled to the first fan housing, and first and second guidance tracks positioned on opposing sides of an open channel. Each of the first and second guidance tracks has a first track portion extending from a first face of a chassis in a first direction into the chassis and a second track portion extending from the first track portion in a second direction. The first guidance member moves along the first guidance track and the second guidance member moves along the second guidance track, wherein the first fan housing moves along the first track portion in a sideways orientation and reaches an operating orientation in the second track portion.

The first fan is preferably a conventional axial fan having a fan housing depth or thickness that is less than the diameter of the fan. In one embodiment, the guidance members may extend from a bracket secured to the fan housing, for example using threaded fasteners, wherein the handle is pivotably coupled to the bracket. The guidance members are preferably positioned on opposing sides of the fan housing adjacent a back face of the fan housing. The guidance members may be pins or pegs that share a common centerline, allowing the guidance members to pivot within the guidance track.

As used herein, the term "sideways orientation" is intended to mean that a closed side of the fan housing is directed forward, regardless of the direction of the inlet face or the outlet face of the fan. Accordingly, the sideways orientation of the first fan housing may be characterized by the first fan housing presenting a minor cross-section as the first fan housing moves along the first track portion through the open channel. Typically, the sideways orientation would be an ineffective orientation for operating the fan since the direction of airflow produced by the fan would be ineffective at cooling components within the chassis. In a specific option, the sideways orientation of the first fan housing may be characterized by an axial centerline of the first fan being generally orthogonal to the first direction.

As used herein, the term "operating orientation" is intended to mean that an inlet face or outlet face of the fan housing is directed in a desired orientation for operation of the fan. A fan may be in an operating orientation despite an axial centerline of the fan being at an angle from horizontal or vertical, wherein the operating orientation is an effective orientation for use of the fan.

The open channel has an opening in the first face of the chassis. Optionally, the height of the opening in the first face may be less than the height of the fan housing, but greater than the depth of the first fan housing.

The first handle may include a first guidance member that moves along the first guidance track and a second guidance member that moves along the second guidance track. Accordingly, the guidance members of the fan housing and the guidance members of a handle may use and follow the same guidance tracks. In one embodiment, the first and second guidance tracks each have a second track portion that is curved. A curved second track portion will redirect and move the fan housing into an operating orientation, which may be directly behind a component within the chassis.

The first handle may include a first latch secured to a distal end of the first handle, wherein the first latch releasably secures the first handle in an installed position with the first fan positioned in the second track portion of the first and second guidance tracks. With the first handle latched, the first fan is unable to move in either direction along the track and the pivot point formed between the handle and the fan housing is set in a fixed position. Accordingly, since the guidance members on fan housing are secured within the second track portion and the connection with the latched handle is in a fixed position, the fan housing is releasably secured in an operable position. Furthermore, the first latch may be released, such that the first handle may be used to pull the first fan out of the chassis perhaps for the purpose of replacing a failed fan.

In a further embodiment, a component is supported within the chassis in a position along the first face of the chassis, wherein the open channel and the first and second guidance tracks extend into the chassis from the first face of the chassis. For example, the component may be a data storage device, such as a hard disk drive or a solid state flash drive. In one option, the first track portion of the first and second guidance tracks extends along a first side of the component, wherein the second track portion of the first and second guidance tracks extends along a distal end of the component, and wherein the first fan is installed in a position directly behind the component. One benefit of various embodiments of the present invention is that the fan may be installed behind the component without having to remove the component.

Embodiments of the invention may further comprise a second fan, a second handle and a second set of guidance tracks in order to install the second fan via the same open channel as is used to install the first fan. Accordingly, the apparatus may further comprise a second fan having a second fan housing with third and fourth guidance members extending from opposing sides of the second fan housing, wherein the second fan housing has a depth that is less than the width. A second handle is pivotably coupled to the second fan housing. The apparatus further comprises third and fourth guidance tracks positioned on opposing sides of the open channel, each of the third and fourth guidance tracks having a first track portion extending from a first face of the chassis in the first direction into the chassis and a second track portion extending from the first track portion in a third direction, wherein the third guidance member moves along the third guidance track and the fourth guidance member moves along the fourth guidance track. While the first and second fans and their corresponding handles and sets of guidance tracks may be identical, the third and fourth guidance tracks may be inverted relative to the first and second guidance tracks. Beneficially, two sets of the same fans, handles and guidance tracks may be used in association with each open channel.

Optionally, the second segments of the first and second guidance tracks may be different from the second segments of the third and fourth guidance tracks in order to install the first fan in a first operable position at a first angular orientation and install the second fan in a second operable position at a second angular orientation that is different than the first angular orientation. In other words, the first and second guidance tracks may direct installation of the first fan to a first position at a first angle, and the third and fourth guidance tracks may direct installation of the second fan to a second position at a second angle.

In a further embodiment of the apparatus, a first fan connector may be secured to the first handle, wherein the first fan connector is electrically coupled to a motor of the first fan, and wherein the first fan connector is inwardly directed parallel to the guidance tracks. Furthermore, a second fan connector may be secured inside the chassis, wherein the second fan connector is electrically coupled to a power supply, and wherein the second fan connector is outwardly directed parallel to the guidance tracks and positioned to align and connect with the first fan connector during movement of the first handle along the first and second guidance tracks in the first direction. Completing such a connection may be referred to as "blind mating" since the first and second connectors are aligned and connected merely by moving the handle within the guidance tracks without requiring personnel to visually observe and manually guide the connectors together.

Another embodiment of the present invention provides a method comprising inserting a first fan into an open channel of a chassis in a sideways orientation, engaging the first fan with a first track that extends into the chassis through the open channel, and pushing the first fan along the first track using a first handle, wherein the first track guides the first fan through the open channel in the sideways orientation to a first operable position in an operating orientation. The first track preferably includes first and second guidance tracks positioned on opposing sides of an open channel.

In one option, the method may further comprise blind mating a first electrical connector to a second electrical connector, wherein the first electrical connector is secured to the first handle and the second electrical connector is secured to the chassis.

In another option, the chassis supports a component within the chassis in a position along a first face of the chassis, wherein the open channel and the first track extend into the chassis from the first face of the chassis, and wherein the operable position of the first fan is directly behind the component.

In yet another option, the method may further comprise inserting a second fan into the open channel of the chassis in a sideways orientation, engaging the second fan with a second track that extends into the chassis through the open channel, and pushing the second fan along the second track using a second handle, wherein the second track guides the second fan through the open channel in the sideways orientation to a second operable position in an operating orientation.

In a further option, the method may further comprise releasably latching the first handle in an installed position with the first fan positioned in the first operable position, and releasably latching the second handle in an installed position with the second fan positioned in the second operable position.

While the foregoing discussion has been directed at installation of one or more fan into a chassis, a significant advantage of various embodiments of the present invention is that a fan may be removed and replaced without interrupting operation of the components, such as data storage device, or interrupting operation of other fans within the chassis. In embodiments with first and second fans installed through a common channel, either fan may be removed and/or replaced without disturbing the other fan.

Accordingly, the fan latch may be released so that the handle may be pulled out of the channel. The guidance members move within the guidance tracks so that the fan housing is withdrawn through the channel in a sideways orientation. Once removed, the fan may be repaired or replaced. Furthermore, a replacement fan that is already coupled to a handle with the fan's power connector secured to the handle may be immediately installed in place of the fan that has been removed. Therefore, embodiments of the present invention support continued operation of the components in the chassis and facilitate a fast and easy replacement of a fan.

FIG. 1 is a perspective view of a chassis 10 capable of supporting a plurality of components 12 and fans (not shown) installed from a front face 14 of the chassis 10. The components 12 may be, for example, hard disk drives or solid state data storage devices. While the components 12 are installed from the front face 14 of the chassis 10, the components are supported within the chassis 10, extending behind the front face some distance. Accordingly, the components 12 and supporting circuit boards may occupy the spaces 16, 18 shown using dashed lines. While the occupied spaces 16, 18 account for most of the front face 14 of the chassis 10, a central area 15 of the front face 14 remains available for other purposes. Furthermore, a space 19 between the occupied spaces 16, 18 is directly behind the central area 15 of the front face 14 and may be used in accordance with the present invention.

In the embodiment shown, the central area 15 has been divided into six (6) open channels 17 having guidance tracks 20 on opposing sides of each channel 17. As will be described in detail in reference to the following drawings, the guidance tracks 20 and the open channels 17 may be used to install fans into the chassis 10. In the embodiment shown, the six (6) channels 17 include twelve (12) sets of opposing guidance tracks 20 to facilitate the independent installation and removal of twelve (12) fans into the space 22 behind the components 12 (i.e., behind the occupied spaces 16, 18). Note that the chassis 10 may optionally extend further behind the space 22 (as suggested by the dashed lines 24), but the invention may be fully implemented in the chassis 10 as shown.

Figure 2A:
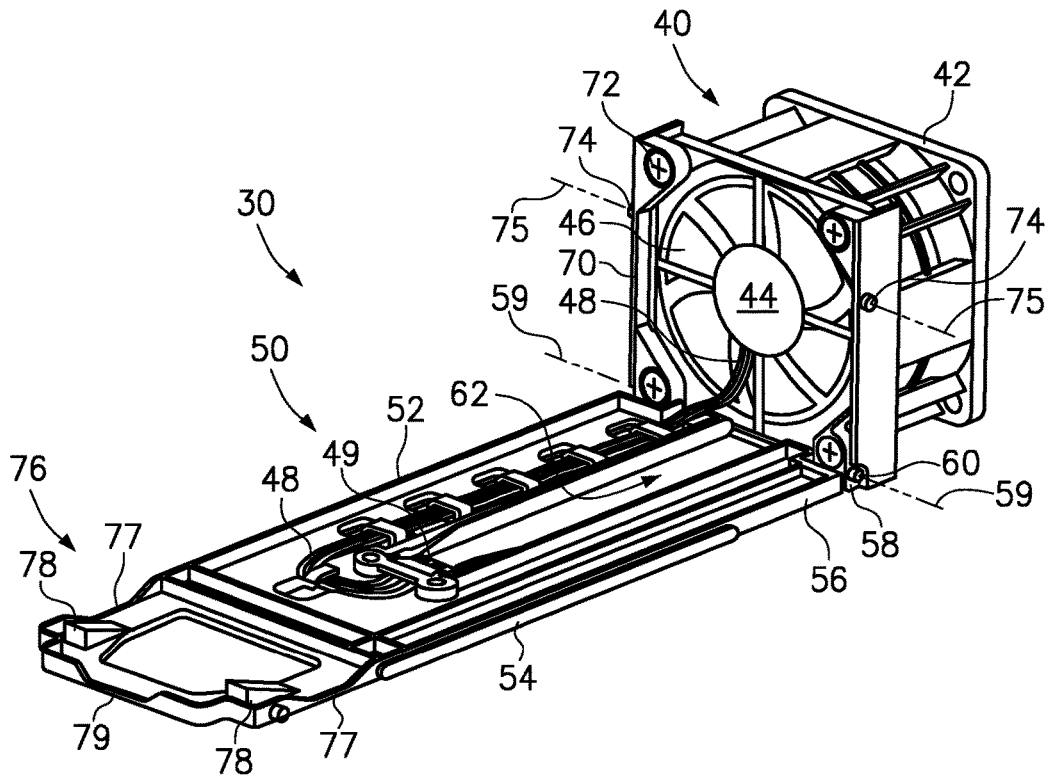
FIGS. 2A and 2B are perspective views of a fan assembly including a fan housing and a handle.
Figure 2B:
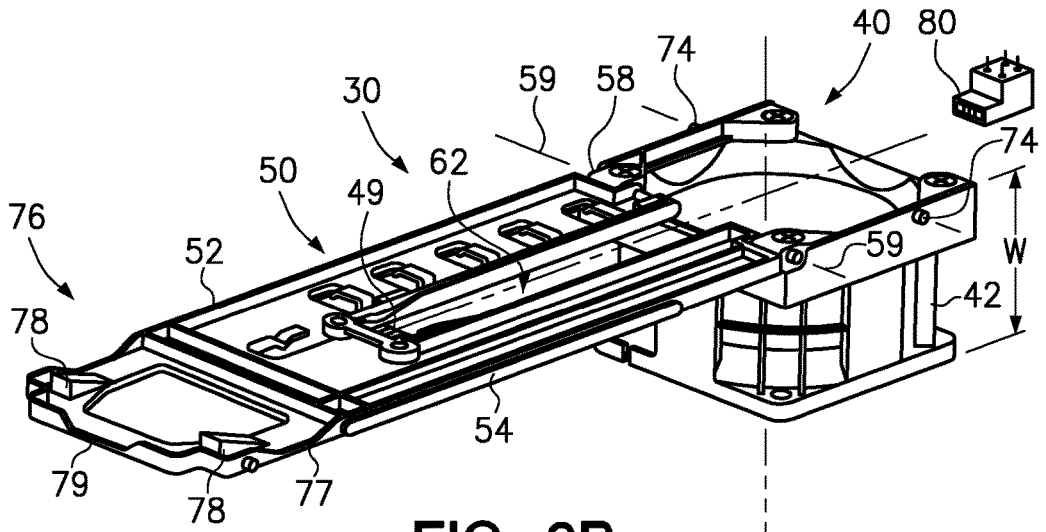

FIGS. 2A and 2B are perspective views of a fan assembly 30 including a fan 40 and a handle 50. The fan 40 includes a fan housing 42, a fan motor 44 and a set of fan blades 46. The fan 40 may be a conventional axial fan with no modifications necessary. As shown, the fan 40 further includes wires 48 extending from the fan motor 44 along the handle 50 to a connector 49. The location and orientation of the connector 49 on the handle 50 allows the connector 49 to blind mate with another connector (see connector 80 shown in FIG. 2B) that is part of the chassis in which the fan assembly 30 is to be installed.

The handle 50 has a long body portion 52 that is as wide as the open channel 17 and extends between opposing guidance tracks 20 (See FIG. 1). The two opposing edges of the body portion 52 have guidance members 54 that are receivable within with guidance tracks 20 (See FIG. 1). A distal end 56 of the handle 50 forms a pivotable connection with the fan 40, such as a hinge 58 with one or more hinge pin 60. As shown, the hinge 58 includes first and second hinge pins 60 so that the hinge 58 does not block an open passage 62 in the handle body portion 52 leading to the connector 49.

In this embodiment, the pivotable connection between the handle body portion 52 and the fan housing 42 is facilitated by a bracket 70. The bracket 70 is secured to the fan housing 42 using threaded fasteners 72 secured to the conventional threaded holes in the four corners of the fan housing 42. As shown, the bracket 70 extends around three sides of the fan housing 42 without blocking any airflow through the fan 40. One edge of the bracket 70 forms the hinge 58 with the handle 50, so that the bracket 70 and attached fan 40 will pivot about the axis 59 of the hinge pins 60. Two opposing edges of the bracket 70 each support a guidance member 74, such as a pin or peg, which defines a pivot axis 75.

A latch 76 is formed at a proximal end of the handle 50 in order to secure the handle 50 and the fan 40 in an installed position, which is described below. The latch 76 includes a resilient portion 77 that can be manually bent, but which is self-biasing to return to a position aligned with the handle body portion 52. The latch 76 further includes a pair of latch members 78 with an inclined surface to facilitate latching and a squared off surface to retain the latch in a chassis. As shown, the latch 76 still further includes a grip 79 for manually overcoming the bias in the resilient portion 77 to release the latch members 78.

In specific reference to FIG. 2B, the fan housing 42 has been pivoted about the axis 59 of the hinge 58 so that the fan housing 42 is in a sideways orientation with the guidance members 74 of the fan housing 42 in alignment with the guidance members 54 of the handle 50. This represents a preferred condition of the fan assembly 30 for insertion into one of the channels 17 (see FIG. 1). The preferred condition of the fan assembly 30 may also be inverted depending upon the orientation of the guidance track 20 (see FIG. 1) into which the fan assembly 30 is being inserted.

A schematic representation of the connector 80 is shown in FIG. 2B in alignment with the connector 49 on the handle 50. The design of the handle 50 and the bracket 70 keep the passage 62 open so that the connectors 49, 80 will blind mate during insertion of the fan assembly 30 into the chassis. Passage 62 also allows additional airflow to pass to the fan in the operating position when the fan is mounted behind components in the occupied spaces 16, 18.

Figure 3A:
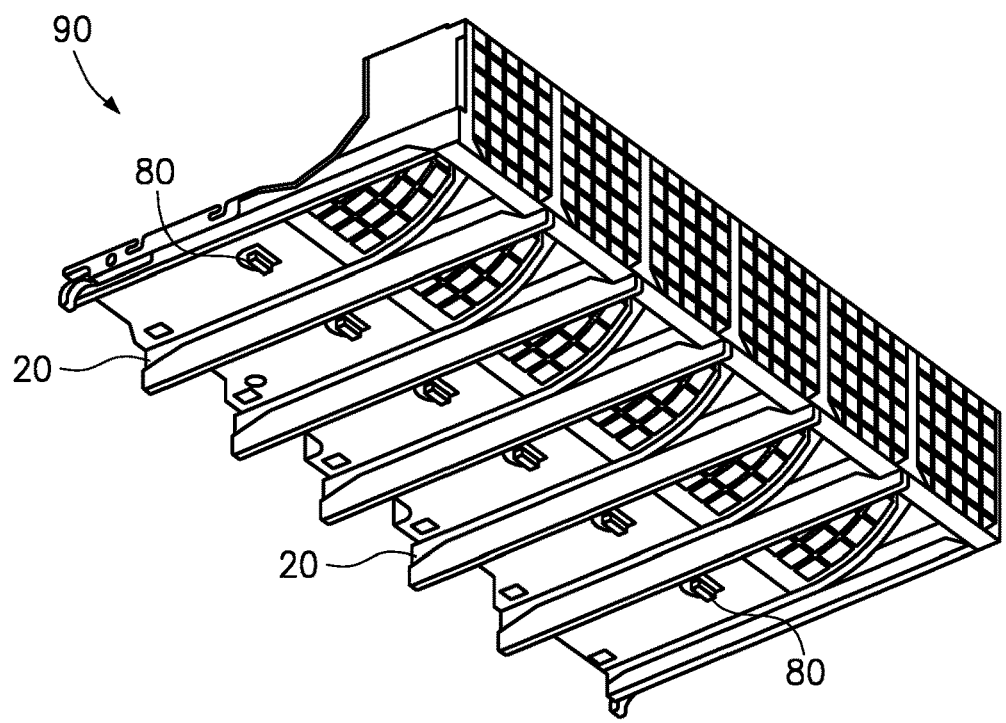
FIG. 3A is a bottom perspective view of a first assembly of guidance tracks.

FIG. 3A is a bottom perspective view of a first assembly 90 of guidance tracks 20. The first assembly 90 includes the upper six (6) sets of opposing guidance tracks 20 that are partially shown in FIG. 1. Accordingly, the first assembly 90 may be used to install six (6) fan assemblies 30 in a side-by-side arrangement. Consistent with FIG. 2B, each of the sets of guidance tracks 20 has a connector 80 extending outward in a position and orientation for alignment with a connector 49 on a handle 50 of the fan assembly 30 (see FIG. 2B).

Figure 3B:
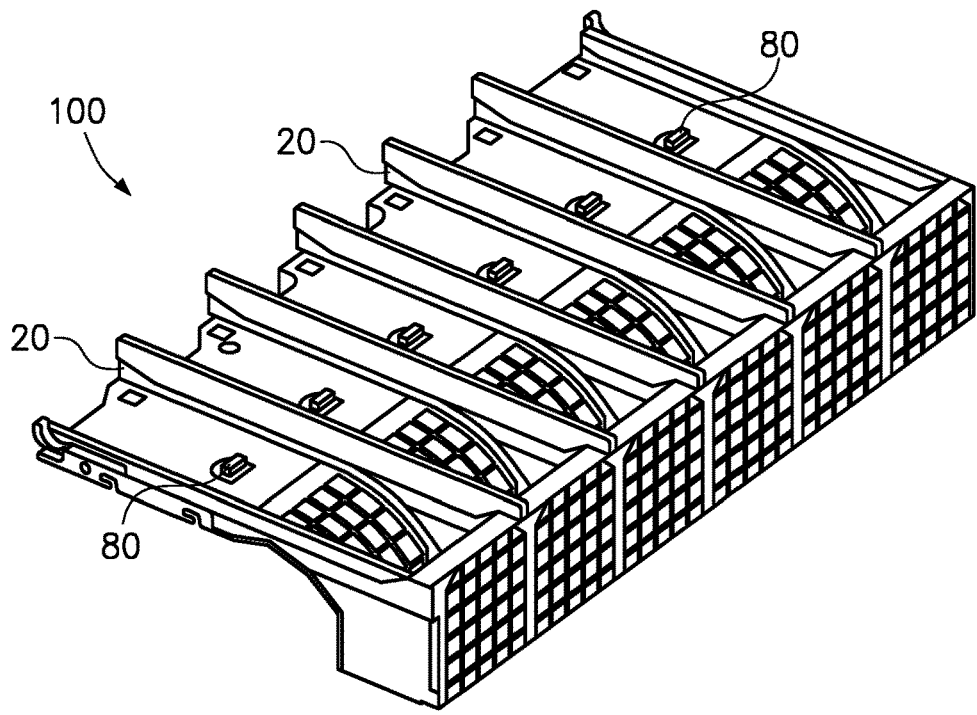
FIG. 3B is a bottom perspective view of a second assembly of guidance tracks.

FIG. 3B is a top perspective view of a second assembly 100 of guidance tracks 20. The second assembly 100 includes the lower six (6) sets of opposing guidance tracks 20 that are partially shown in FIG. 1. Accordingly, the second assembly 100 may be used to install six (6) fan assemblies 30 in a side-by-side arrangement. Consistent with FIG. 2B, each of the sets of guidance tracks 20 has a connector 80 extending outward in a position and orientation for alignment with a connector 49 on a handle 50 of the fan assembly 30 (see FIG. 2B). In fact, the second assembly 100 may be identical to the first assembly 90. It should be recognized that the number of sets of guidance tracks 20 may vary as needed. For purposes of much of the discussion below, a single set of opposing guidance tracks 20 are disclosed.

Figure 4:
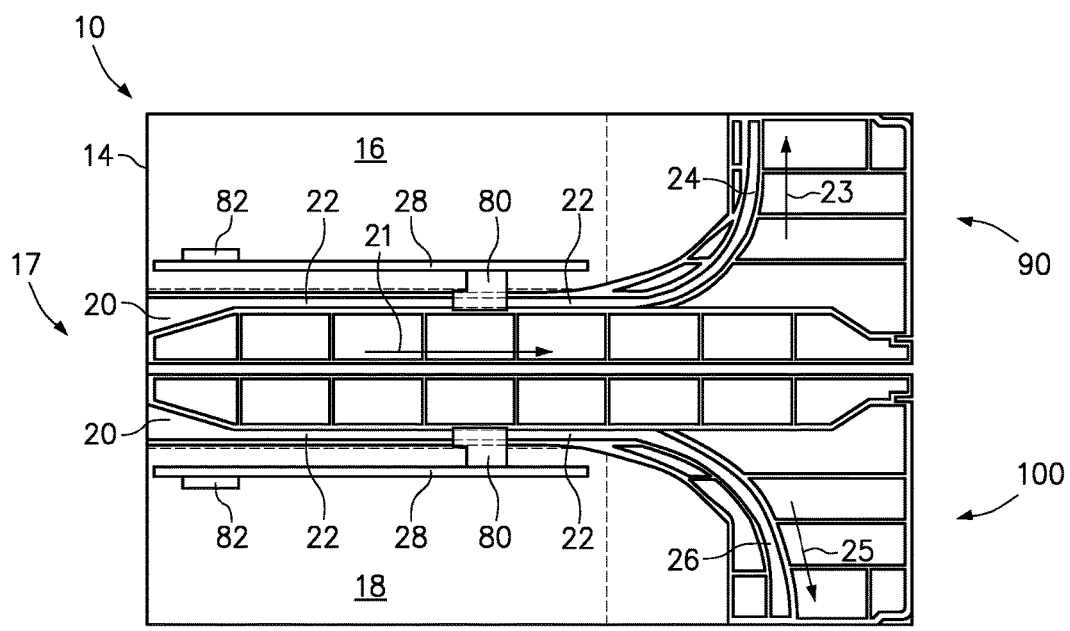
FIG. 4 is a schematic side view of a chassis showing the positions of one upper guidance track and one lower guidance track.

FIG. 4 is a schematic side view of the chassis 10 showing the positions of a first (upper) assembly of guidance tracks 90 and a second (lower) assembly of guidance tracks 100. While the first and second assemblies (sets) of guidance tracks 90, 100 include opposing guidance tracks 20, FIG. 4 illustrates a plan view of only one guidance track 20 of each assembly 90, 100, collectively forming one wall or side of an open channel 17 (see FIG. 1).

As shown, the front face 14 of the chassis 10 is on the left side of the image. The occupied spaces 16, 18, may include components 12 (see FIG. 1) that are accessible from the front face 14. The open space 19 (see FIG. 1) between the upper occupied space 16 and the lower occupied space 18 may form, or be divided into, one or more open channels 17.

Each of the upper guidance tracks 20 (only one shown) have a first track portion 22 extending from the first face 14 of the chassis 10 in a first direction 21 into the chassis and a second track portion 24 extending from the first track portion 22 in a second direction 23. The first and second track portions 22, 24 form a continuous track, but the first track portion 22 is preferably linear and the second track portion 24 is preferably curved away from the first direction 21. Furthermore, each guidance track 20 may have a wide entry along the front face 14 in order to ease the initial engagement of the fan assembly with the guidance tracks 20. While the first and second assemblies (sets) of guidance tracks 90, 100 may be identical, FIG. 4 illustrates the lower guidance tracks 20 (only one shown) having a second track portion 26 with a different direction 25, curvature or pathway.

The occupied spaces 16, 18 may each further include a separate circuit board 28 that may provide various functions, such as a memory controller, redundant array of independent disks (RAID) controller, power distribution and control, and a fan controller. Furthermore, the circuit boards 28 may each support the connector 80, which is used to supply power, and perhaps control signals, to the fan 40 (see FIGS. 2A and 2B). Furthermore, the connector 80 may receive fan speed measurements and other operating data from the fan 40. Such control signals and operating data may be provided by, or received by, a service processor 82 on the circuit board 28.

Figure 5A:
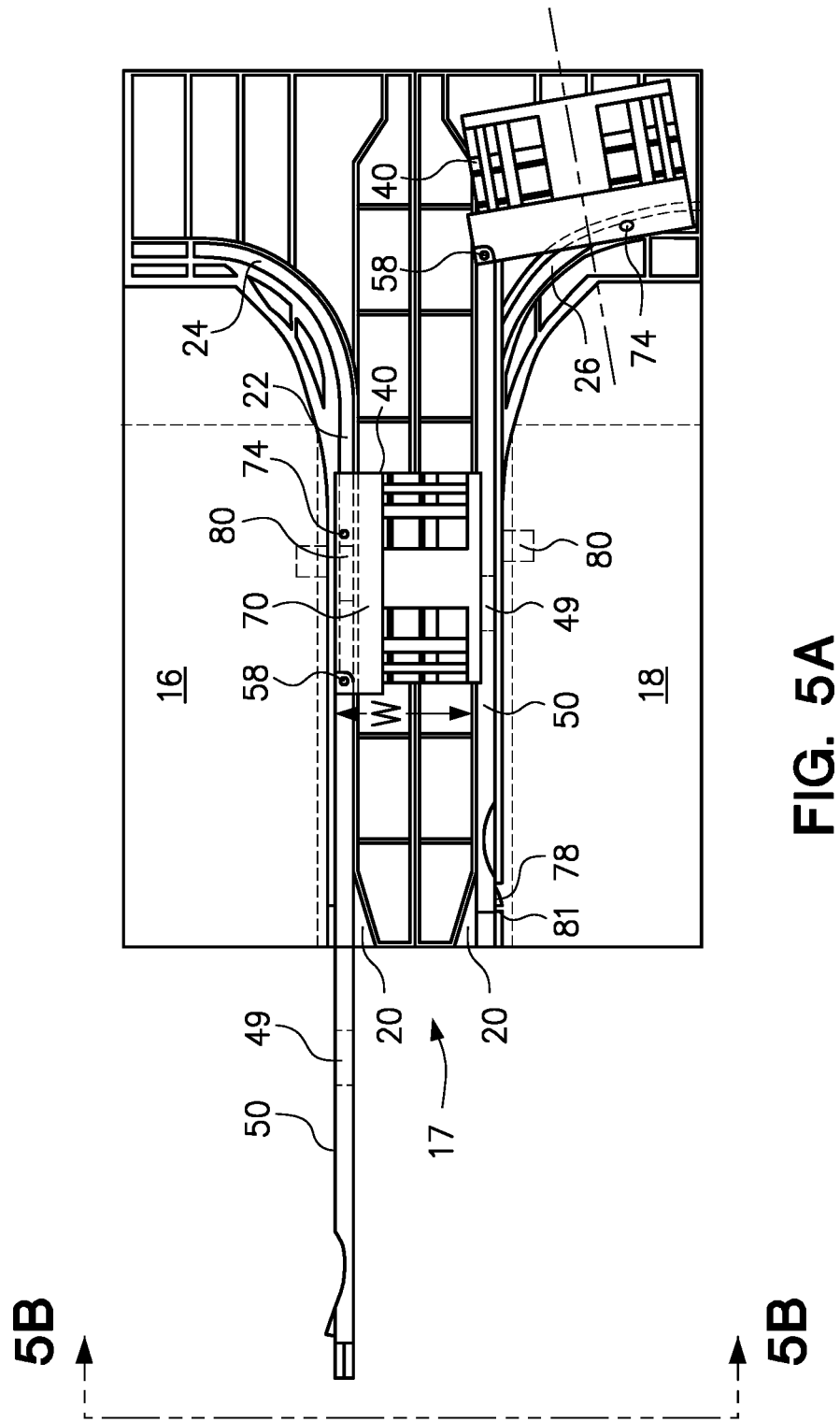
FIG. 5A is a schematic side view of the chassis with a first fan installed in a first operable position and a second fan being guided along a second track toward a second operable position.

FIG. 5A is a schematic side view of the chassis 10 with a first (lower) fan 40 installed in a first operable position in the lower half of the chassis and a second fan 40 being guided along a second track toward a second operable position in the upper half of the chassis. In reference to the fan 40 in the lower half of the chassis, the guidance member 74 on the fan housing 42 is within the second portion 26 of the track 20. The handle 50 has been fully inserted into the open channel 17, such that the squared off surface of the latch members 78 have been received against a hole or recess 81 formed in the chassis. In this latched and fully installed position, the hinge 58 extends forward to establish the operable position of the fan 40. This position is similar to the position shown in FIG. 2A. In this illustration, the lower fan 40 has an operable position with its axial centerline at about a 10 degree angle to horizontal. This angle may be changed by varying the path of the second portion 26 of the track 20, varying the location of the guidance member 74, or varying the length of the handle 50 and therefore the position of the hinge 58. Furthermore, the connector 49 (see dashed outline) on the handle 50 and the connector 80 (see dashed outline) secured to the chassis 10 are in electronic communication.

In reference to the fan 40 in the upper half of the chassis 10, the guidance member 74 on the fan housing 42 and the guidance member 54 (see FIGS. 2A and 2B) on the handle 50 are both received in the first portion 22 of the track 20. Accordingly, the position of the fan assembly is similar to the position shown in FIG. 2B in that the fan 40 is in a sideways orientation. In this orientation, the fan 40 is able to move through the open channel 17 even though the dimensions of the open channel 17 would not allow the fan 40 to be move through the open channel 17 in an operating orientation. Specifically, the height of the open channel 17 is sufficient to accommodate the width of the fan housing 42 and bracket 70 of one fan assembly, as well as the width of the handle 50 of another fan assembly already installed through the same open channel 17.

Notice the alignment of the connector 49 (see dashed lines) on the handle 50 of the upper fan assembly with the connector 80 (see dashed lines) secured to the chassis 10 (see also FIG. 4). Accordingly, once the handle 50 has reached the installed position (as with the lower fan assembly), the connectors 49, 80 will establish electronic communication between the fan 40 and a power supply, such as through a circuit board.

Figure 5B:
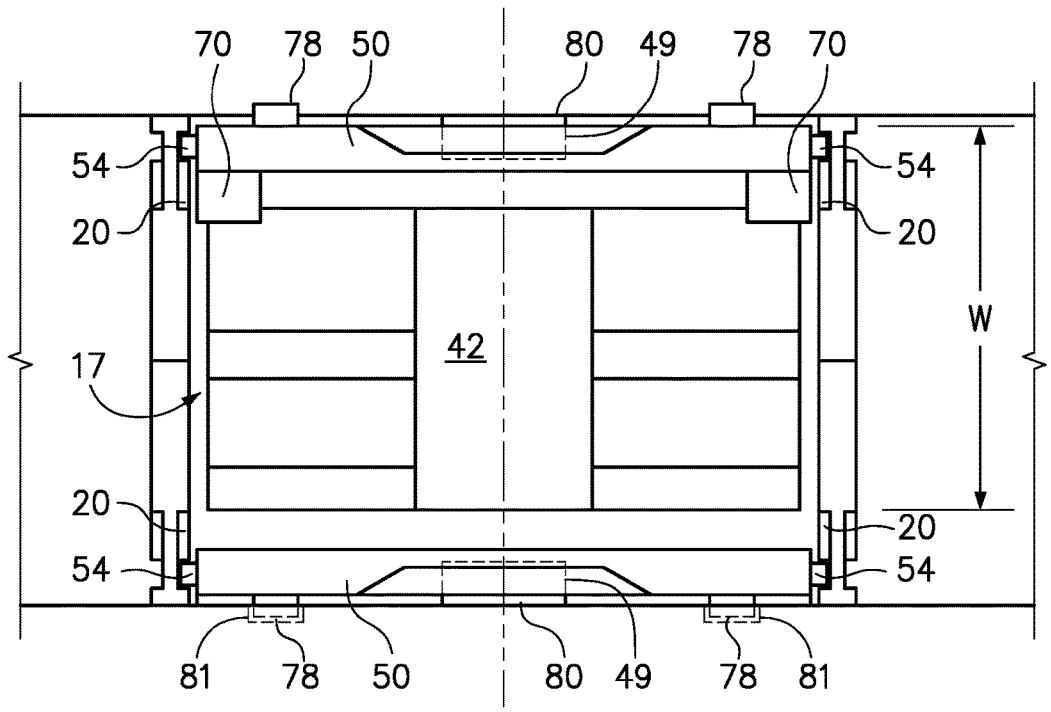
FIG. 5B is an end view of the open channel of FIG. 5A showing the position of the first handle and the second fan being guided along the second track.

FIG. 5B is an end view of the open channel 17 of FIG. 5A showing the position of the first (lower) handle 50 and the second (upper) fan housing 42 being guided along the second (upper) track 20. The width W of the fan housing 42 and bracket 70 allows the fan housing 42 and bracket 70 to move through the open channel 17 despite the presence of the handle 50 of the lower fan assembly.

This view also illustrates the alignment of the connectors 49, 80 in reference to both the upper and lower fan assemblies. Furthermore, the guidance members 54 of the handles 50 are shown received within respective guidance tracks 20. Still further, this view shows that the latch members 78 of the lower handle 50 have been received into a recess 81 in the chassis 10, while the latch members 78 of the upper handle 50 have yet to be received into the open channel 17.

Figure 6:
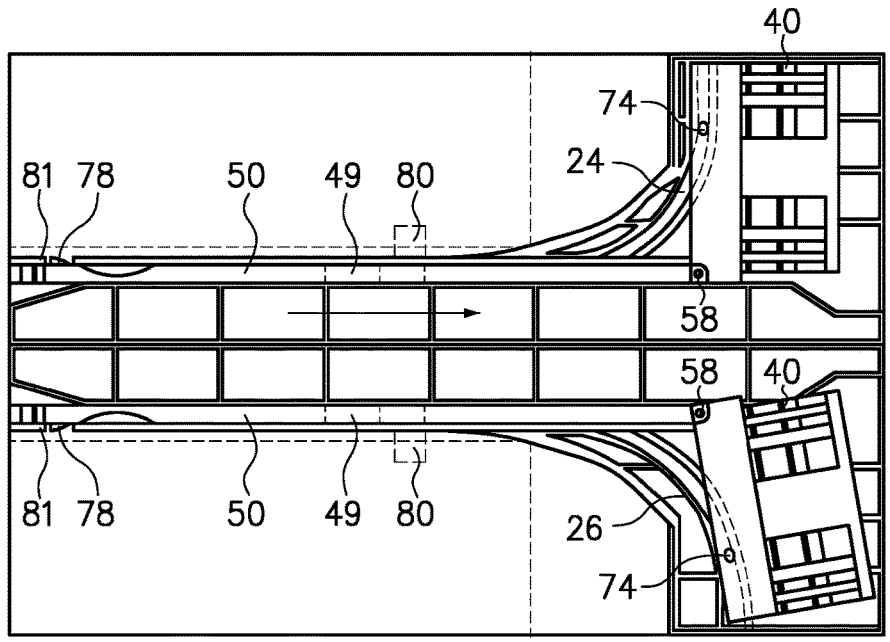
FIG. 6 is a schematic side view of the chassis with the first fan installed in a first operable position and the second fan installed in a second operable position.

FIG. 6 is a schematic side view of the chassis 10 as in FIG. 5A with the first (lower) fan installed in a first operable position and the second (upper) fan installed in a second operable position. The lower fan assembly is in the fully installed position as described in reference to FIG. 5A. However, the upper fan assembly is now also in a fully installed and operable position.

In reference to the fan 40 in the upper half of the chassis, the guidance member 74 on the fan housing 42 is now within the second portion 24 of the track 20. The handle 50 has been fully inserted into the open channel 17, such that the squared off surface of the latch members 78 have been received against the hole or recess 81 formed in the chassis. In this latched and fully installed position, the hinge 58 extends forward to establish the operable position of the fan 40. This position is similar to the position shown in FIG. 2A. In this illustration, the upper fan 40 has an operable position with its axial centerline substantially horizontal or in-line with the insertion direction 21. This angle may be changed by varying the path of the second portion 24 of the track 20 (see second track portion 26 for the first (lower) fan by comparison), varying the location of the guidance member 74, or varying the length of the handle 50 and therefore the position of the hinge 58 when the handle is fully inserted. Furthermore, the connector 49 (see dashed outline) on the handle 50 and the connector 80 (see dashed outline) secured to the chassis 10 are now in electronic communication.

Embodiments of the present invention allow for a fan to pass between hard disk drive bays, for example, such that the fan can be installed behind the hard disk drives without having to move or extend the hard disk drives out of the way. As a specific example, a 60×60 mm fan, which is an industry standard, would normally occupy at least 60×60 mm of area (60 mm vertically by 60 mm horizontally) on the front face of the chassis. But a 60×60 mm industry standard fan comes in a variety of thicknesses or widths (W), such as a width of 25 mm or 38 mm. In accordance with embodiments of the present invention, the width dimension of the fan can be deployed as one of the dimensions that is attributed to the frontal area. Accordingly, a 60×60×25 mm fan can be installed through an open channel that is about 60 mm width and perhaps 35 mm in height (assuming the second handle and gaps only total about 10 mm).

Referring again to FIG. 5A, the position of the upper fan 40 is also representative of the removal of the upper fan 40 after being fully installed and operational as in FIG. 6. As shown, as the handle 50 is pulled from the channel 17, the connector 49 is automatically disconnected from the fixed connector 80 and the fan passes through the channel in a sideways orientation. Either of the upper and lower fans 40 may be removed in this manner.

Figure 7:
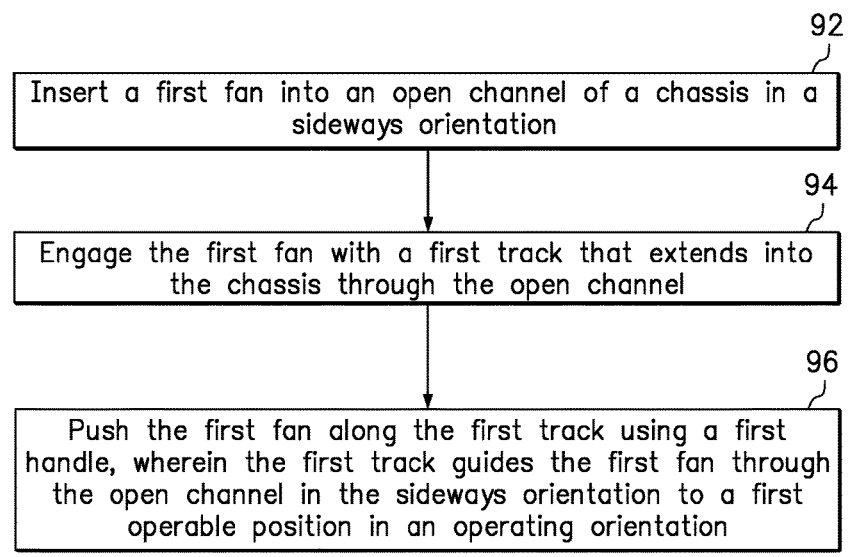
FIG. 7 is a flowchart of a method according to another embodiment of the present invention.

FIG. 7 is a flowchart of a method according to one embodiment of the present invention. In step 92, the method includes inserting a first fan into an open channel of a chassis in a sideways orientation. In step 94, the method includes engaging the first fan with a first track that extends into the chassis through the open channel. In step 96, the method includes pushing the first fan along the first track using a first handle, wherein the first track guides the first fan through the open channel in the sideways orientation to a first operable position in an operating orientation.

While not shown in FIG. 7, the method may further include installation of a second fan, for example as shown in FIG. 6. Accordingly, after step 96, the method may further include inserting a second fan into the open channel of the chassis in a sideways orientation, engaging the second fan with a second track that extends into the chassis through the open channel, and pushing the second fan along the second track using a second handle, wherein the second track guides the second fan through the open channel in the sideways orientation to a second operable position in an operating orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
a first fan having a first fan housing with first and second guidance members extending from opposing sides of the first fan housing, wherein the first fan housing has a depth that is less than a height and width of the first fan housing;
a first handle pivotably coupled to the first fan housing;
first and second guidance tracks positioned on opposing sides of an open channel that extends into a chassis from a first face of a chassis, each of the first and second guidance tracks having a first track portion extending along the open channel in a first direction into the chassis and a second track portion extending along the open channel in a second direction, wherein the first guidance member moves along the first guidance track and the second guidance member moves along the second guidance track, and wherein the first fan housing moves along the first track portions of the first and second guidance tracks in a sideways orientation and reaches an operating orientation in the second track portions of the first and second guidance tracks;
a second fan having a second fan housing with third and fourth guidance members extending from opposing sides of the second fan housing, wherein the second fan housing has a depth that is less than a height and width of the second fan housing;
a second handle pivotably coupled to the second fan housing; and
third and fourth guidance tracks positioned on opposing sides of the open channel, each of the third and fourth guidance tracks having a first track portion extending along the open channel in the first direction into the chassis and a second track portion extending from the first track portions of the third and fourth guidance tracks in a third direction, wherein the third guidance member moves along the third guidance track and the fourth guidance member moves along the fourth guidance track.

2. The apparatus of claim 1, wherein the sideways orientation of the first fan housing is characterized by an axial centerline of the first fan being orthogonal to the first direction.

3. The apparatus of claim 1, wherein the sideways orientation of the first fan housing is characterized by the first fan housing presenting a minor cross-section as the first fan housing moves along the first track portions of the first and second guidance tracks through the open channel.

4. The apparatus of claim 1, wherein the open channel has an opening in the first face of the chassis having a height that is less than the height of the first fan housing and greater than the depth of the first fan housing.

5. The apparatus of claim 1, wherein the first handle further includes a first handle guidance member that moves along the first guidance track and a second handle guidance member that moves along the second guidance track.

6. The apparatus of claim 5, further comprising:
a first fan connector secured to the first handle, wherein the first fan connector is electrically coupled to a motor of the first fan, and wherein the first fan connector is inwardly directed parallel to the guidance tracks; and
a second fan connector secured inside the chassis, wherein the second fan connector is electrically coupled to a power supply, and wherein the second fan connector is outwardly directed parallel to the guidance tracks and positioned to align and connect with the first fan connector during movement of the first handle along the first and second guidance tracks in the first direction.

7. The apparatus of claim 5, further comprising:
a first latch secured to a distal end of the first handle, wherein the first latch releasably secures the first handle in an installed position with the first fan positioned in the second track portions of the first and second guidance tracks.

8. The apparatus of claim 1, wherein the second track portions of the first and second guidance tracks are curved.

9. The apparatus of claim 1, further comprising:
a component supported within the chassis in a position along the first face of the chassis.

10. The apparatus of claim 9, wherein the first track portions of the first and second guidance tracks extend along a first side of the component, wherein the second track portions of the first and second guidance tracks extend along a distal end of the component, and wherein the first fan is installed in a position directly behind the component.

11. The apparatus of claim 10, wherein the component is a data storage device.

12. The apparatus of claim 1, wherein the first and second fans are identical.

13. The apparatus of claim 12, wherein the first and second guidance tracks direct installation of the first fan to a first position at a first angle, and wherein the third and fourth guidance tracks direct installation of the second fan to a second position at a second angle that is different than the first angle.

14. The apparatus of claim 12, wherein the open channel has a rectangular cross-section having a first dimension that is greater than the sum of the depth of the first fan housing and a thickness of the second handle, less than the sum of the depths of the first and second fans, and less than the height of the first fan housing.

15. The apparatus of claim 1, wherein the third and fourth guidance tracks are identical to the first and second guidance tracks and have an inverted orientation relative to the first and second guidance tracks.

16. The apparatus of claim 1, further comprising:
a second component supported within the chassis in a position along the first face of the chassis, wherein the first track portions of the third and fourth guidance tracks extend along a first side of the second component, wherein the second track portions of the third and fourth guidance tracks extend along a distal end of the second component, and wherein the second fan is installed in a position directly behind the second component.

17. The apparatus of claim 16, wherein the first and second components have a space therebetween, and wherein the first track portions of the first and second guidance tracks and the first track portions of the third and fourth guidance tracks extend through the space between the first and second components.

18. The apparatus of claim 1, wherein the second fan housing moves along the first track portions of the third and fourth guidance tracks in a sideways orientation and reaches an operating orientation in the second track portions of the third and fourth guidance tracks.

* * * * *